(12) United States Patent
Chang et al.

(10) Patent No.: US 7,784,007 B2
(45) Date of Patent: Aug. 24, 2010

(54) METHOD FOR AUTOMATICALLY PRODUCING LAYOUT INFORMATION

(75) Inventors: Chen-Yun Chang, Taipei County (TW); Liao-Ming Chiang, Taipei (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 281 days.

(21) Appl. No.: 11/862,196

(22) Filed: Sep. 27, 2007

(65) Prior Publication Data

US 2009/0089733 A1 Apr. 2, 2009

(51) Int. Cl.
*G06F 17/50* (2006.01)

(52) U.S. Cl. ............... 716/11; 716/5; 716/12; 716/13; 716/14

(58) Field of Classification Search ............ 716/5, 716/8–14
See application file for complete search history.

(56) References Cited

U.S. PATENT DOCUMENTS

| 7,003,362 B2 | 2/2006 | Tsao | |
|---|---|---|---|
| 7,069,533 B2 | 6/2006 | Kochpatcharin | |
| 2005/0076316 A1* | 4/2005 | Pierrat et al. | 716/4 |
| 2008/0228460 A1* | 9/2008 | Lin et al. | 703/14 |

* cited by examiner

*Primary Examiner*—Vuthe Siek
(74) *Attorney, Agent, or Firm*—Winston Hsu

(57) ABSTRACT

A method of automatically producing layout information includes receiving first layout information of an integrated circuit; when receiving the first layout information, activating an automated process mechanism to stores the first layout information into a reference database; reading the first layout information from the reference database by the automated process mechanism; and analyzing the first layout information to obtain second layout information by the automated process mechanism. In an exemplary embodiment, the method of the present invention further includes validating accuracy of the first layout information according to the second layout information.

11 Claims, 4 Drawing Sheets

| Device name | MP001 | | |
|---|---|---|---|
| Unused | | | |
| Layout Desc | Layout Map | Data Type | Top Cell |
| DIFFUSION | 1 | 0 | Top |
| N_WELL | 3 | 0 | Top |
| VTNH | 16 | 0 | Top |
| MVIA2 | 49 | 0 | Top |
| METAL3 | 50 | 0 | Top |
| CONTACT_OPC_BLOCK | 60 | 0 | Top |
| METAL1_DUMMY_BLOCK | 72 | 1 | Top |

Fig. 4

METHOD FOR AUTOMATICALLY PRODUCING LAYOUT INFORMATION

BACKGROUND OF THE INVENTION

1. Field of the Invention

The present invention relates to an automated data processing mechanism, and more particularly, to a method of automatically producing layout information and apparatus thereof.

2. Description of the Prior Art

By the current electronic device manufacturing process, electronic device makers such as mobile phone, computing device and entertainment device manufacturers, transmit the required integrated circuit (IC) first layout information to the semiconductor foundries. In general, the first layout information has various forms including text files, Adobe PDF files, electronic mail (email) and image files. When the employees of the semiconductor foundry receive the first layout information, they must input the layout data one by one into foundry's internal system one by one in the required formats. The first layout information can, however, comprise tens, hundreds, even thousands of data. As a result, this manual process consumes most of the first layout information processing time and introduces higher sources of error.

Furthermore, current first layout information analyzing tools only output marks or numbers, and do not display the device and layer information for convenient subsequent processing. As a result, the foundry employees must compare the non user-friendly information represented by marks or numbers, also adding to processing time and the risk of human error.

SUMMARY OF THE INVENTION

It is an objective of the claimed invention to provide a method of automatically producing layout information to construct an automated flow. As a result, the user end transmits first layout information through the automated flow instead of other document formats to prevent human error and to reduce the time for producing tape-out information.

According to an exemplary embodiment of the present invention, a method of automatically producing layout information is disclosed. The method comprises: receiving first layout information of an integrated circuit; when receiving the first layout information, activating an automated process mechanism to stores the first layout information into a reference database; reading the first layout information from the reference database by the automated process mechanism; and analyzing the first layout information to obtain second layout information by the automated process mechanism.

According to an exemplary embodiment of the present invention, a method of automatically producing layout information is further disclosed. The method comprises: receiving first layout information of an integrated circuit; analyzing the first layout information to obtain an analysis result; providing a predetermined layer mapping table, wherein the predetermined layer mapping table records a plurality of foundry device IDs and a plurality of layer information mapping relationships; and producing the second layout information according to an analysis result of the first layout information and the predetermined layer mapping table.

According to an exemplary embodiment of the present invention, a method of automatically producing layout information is further disclosed. The method comprises: receiving first layout information of an integrated circuit; and analyzing the first layout information to obtain the second layout information, and validating the accuracy of the first layout information according to the second layout information.

According to an exemplary embodiment of the present invention, an apparatus for automatically producing layout information is further disclosed. The apparatus comprises: a processor; and a storage, coupled to the processor, for storing a first program code and a second program code, wherein when the processor executes the first program code, it provides a user interface for receiving first layout information of an integrated circuit; and when receiving the first layout information, the processor executes the second program code to activate an automated process mechanism to analyze the first layout information for obtaining the second layout information.

According to an exemplary embodiment of the present invention, an apparatus for automatically producing layout information is further disclosed. The apparatus comprises: a processor; a predetermined layer mapping table, wherein the predetermined layer mapping table records a plurality of foundry device IDs and a plurality of layer information mapping relationships; and a storage device, coupled to the processor, for storing a first program code and a second program code, wherein when the processor executes the first program code, it provides a user interface for receiving first layout information of an integrated circuit, and when the processor executes the second program code, it analyzes the first layout information to obtain an analysis result, and produces the second layout information according to the analysis result and the predetermined layer mapping table.

According to an exemplary embodiment of the present invention, an apparatus for automatically producing layout information is further disclosed. The apparatus comprises: a processor; and a storage device, coupled to the processor, for storing a first program code and a second program code, wherein when the processor executes the first program code, the first program code provides a user interface for receiving first layout information of an integrated circuit, and when the processor executes the second program code, it analyzes the first layout information to obtain the second layout information, and validates the accuracy of the first layout information according to the second layout information.

In conclusion, the methods of automatically producing layout information and apparatuses thereof will shorten the time necessary for producing the layout information and will also prevent human errors while reducing the time needed for producing tape-out information.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 illustrates the layout information that the system shown in FIG. 3 produces using the method shown in FIG. 1.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
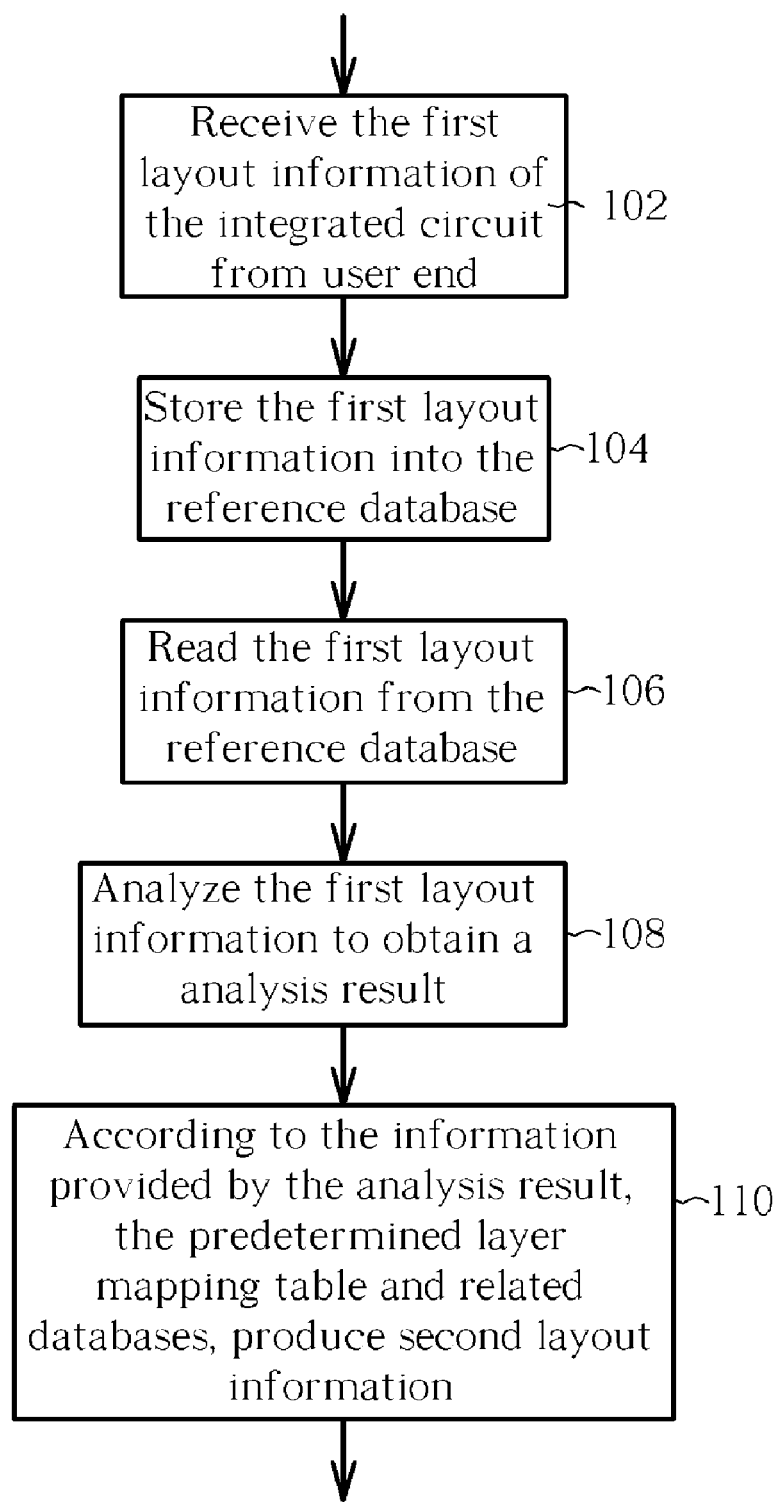
FIG. 1 is a diagram of a method for automatically producing layout information according to an embodiment of the present invention.

Please refer to FIG. 1. FIG. 1 is a diagram of a method for automatically producing layout information according to an embodiment of the present invention. As shown in FIG. 1, first, a system receives first layout information of an integrated circuit from the user end (Step 102). In this embodiment, the first layout information herein is, for example, a layout information database. After the system receives the first layout information, it begins an automated process of producing second layout information corresponding to the standard processes of semiconductor foundries. In Step 104, the system stores the first layout information into a reference database, such as a foundry layout information database. In Step 106, the automated process is triggered to run an analysis program for analyzing the first layout information, wherein the analysis program includes an analysis algorithm and an analysis logic. When the analysis program is triggered for execution, the analysis program then reads the first layout information transmitted by the user end from the reference database. Further in Step 108, the analysis program performs an analysis procedure for the first layout information to produce an analysis result according to a predetermined layer mapping table and a least one database, such as a foundry design rule database, foundry technology database or other related databases. After the analysis program obtains the analysis result, the analysis program then produces the second layout information required according to the information provided by the analysis result, the predetermined layer mapping table, and related databases (Step 110). Finally, the system outputs or displays the second layout information through an interface.

The process shown in FIG. 1 only shows steps relating to the present invention; however, other steps are allowed to be added to or removed from the method shown in FIG. 1 to achieve the same result, and doing so still follows the spirit of the present invention. On the other hand, the user end may transmit a document text file (which contains the tape-out information which has been initially analyzed) directly to the system in advance, as an option during urgent deadlines. The user end later transmits the first layout information (from which the document text file was produced) into the system for performing the aforementioned automated analysis. In addition, if substantially the same results can be obtained, the aforementioned steps need not be limited to be executed according to the exact sequence shown in FIG. 1.

It should be noted that the first layout information has various forms, including but not limited to Organization for the Advancement of Structured Information Standards (OASIS), Graphic Data System (GDS), and $2^{nd}$ Graphic Data System (GDSII). Furthermore, the first layout information also can have various formats, including but again not limited to text files (Microsoft Word or plain-text), Microsoft Excel, portable document format (Adobe PDF), electronic mail (email), facsimile (fax), and even a plurality of photo or image formats. The formats mentioned above are only for illustrative purposes, and do not mean to be taken as limitations of the present invention.

It should be noted that the second layout information of the present invention is a mask tooling request format (MTRF), however, The format mentioned above is only for illustrative purposes, and do not mean to be taken as limitations of the present invention.

Figure 2:
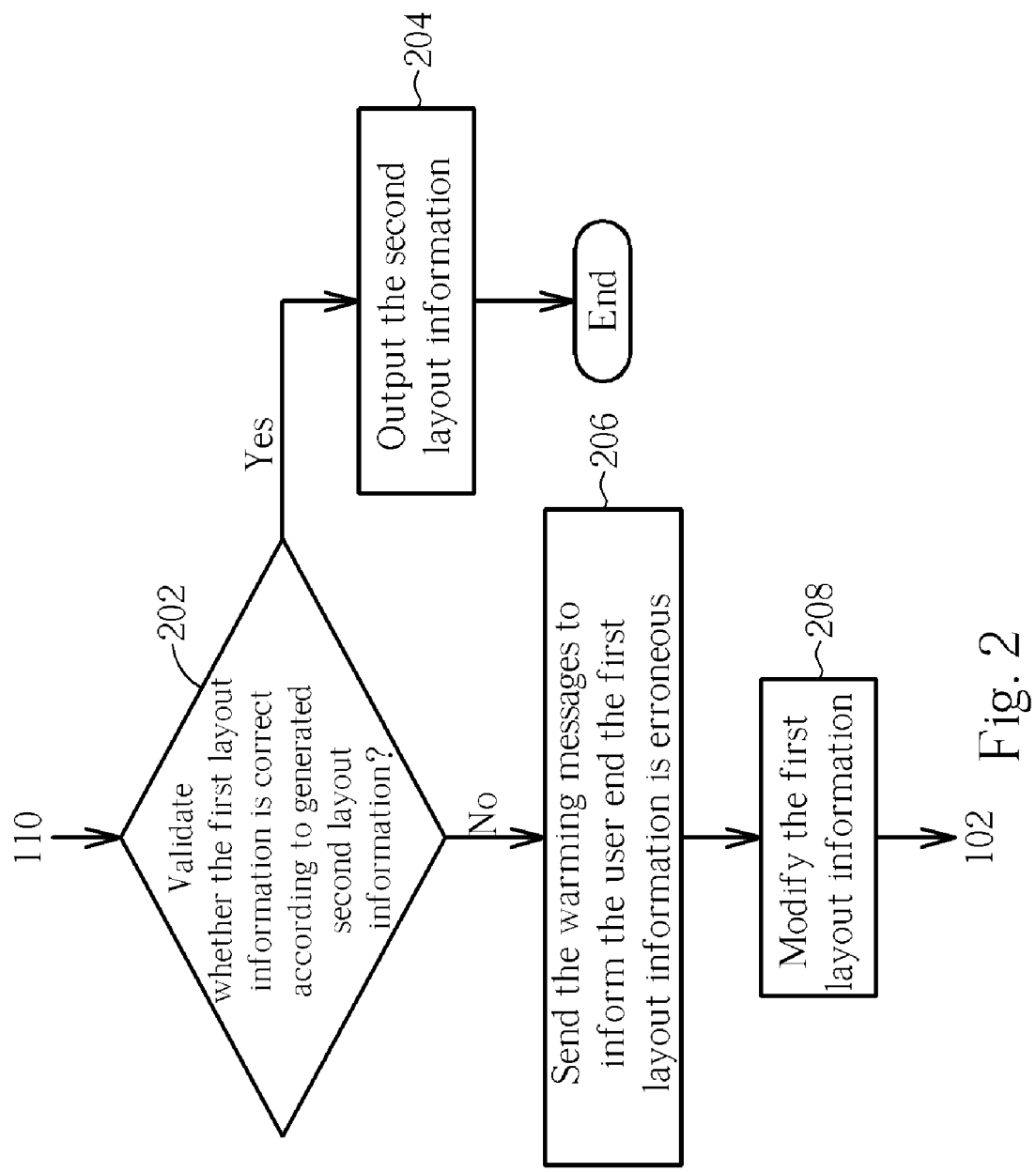
FIG. 2 is a flowchart for one operation example of the method shown in FIG. 1 of outputting the layout information.

Please refer to FIG. 2. FIG. 2 is a flowchart depicting one operation example of the method shown in FIG. 1 of outputting the layout information. This operation procedure illustrates a feedback loop for the method of FIG. 1 to validate whether the first layout information received is error-free. In Step 202, the analysis program validates whether the first layout information received is correct according to the generated second layout information; if the first layout information is correct, the system outputs the MTRF (Step 204); if not, the system sends warning messages to inform the user end that the first layout information transmitted is erroneous (Step 206). After the user end receives this notification message, the user end must perform appropriate modifications to correct the design errors in the original first layout information, as shown in Step 208. When the errors are corrected, the process returns to Step 102 to automatically produce the second layout information according to the newly modified first layout information given by the user end. This validation procedure mentioned above repeats (with the feedback loop) until all errors presented in the first layout information are completely corrected. Finally, in Step 204, the system outputs the second layout information corresponding to the correct first layout information.

Figure 3:
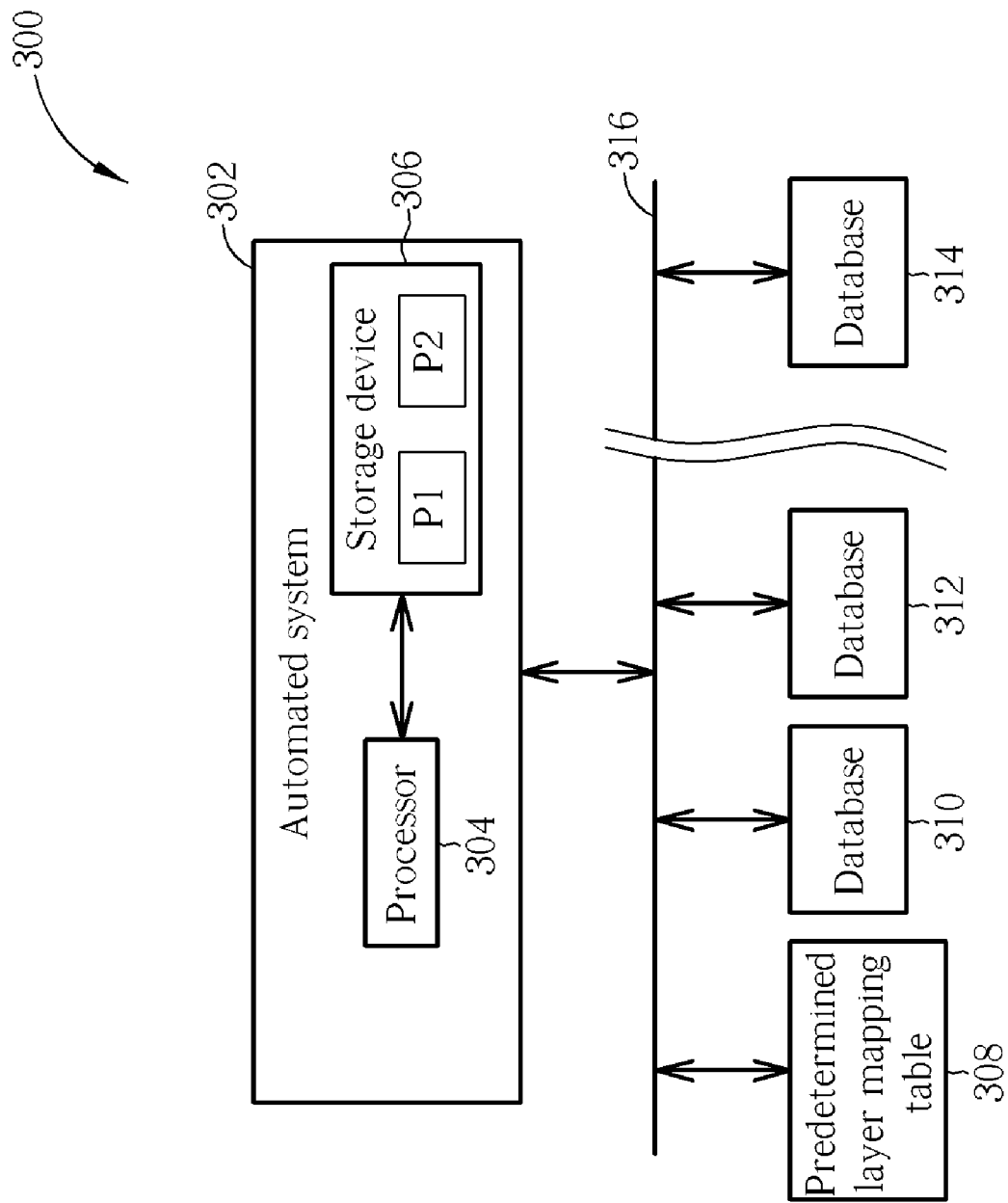
FIG. 3 is a diagram of an apparatus for automatically producing layout information according to an embodiment of the present invention.

Please refer to FIG. 3. FIG. 3 is a diagram of an apparatus 300 for automatically producing layout information according to an embodiment of the present invention. The apparatus 300 is applied to automatically produce second layout information. Specifically, the architecture of the apparatus 300 comprises: an automated system 302, a transmission interface 316 such as Internet or other media, a predetermined layer mapping table 308, and a plurality of databases 310, 312 and 314. The automated system 302 comprises a processor 304 and a storage device 306, such as memory or hard disk, wherein the storage device 306 records a first program code P1 and a second program code P2. In this embodiment, when the first program code P1 is executed by the processor 304, the first program code P1 provides a user interface for the user end to transmit first layout information of an integrated circuit into the semiconductor foundries for later analysis. After the automated system 302 receives the first layout information, processor 304 will execute the second program code P2 to start an automated mechanism to perform the analysis process procedure shown in FIG. 1 and/or the validation process procedure shown in FIG. 2. As shown in FIG. 3, the processor 304 is embedded in the automated system 302 for executing the analysis process of the analysis program shown in FIG. 1 (i.e. the second program code P2) and the validation process of the analysis program shown in FIG. 2 (i.e. the second program code P2) according to the predetermined layer mapping table 308. In this embodiment, the predetermined layer mapping table 308 comprises, without limitation, a device name of a layout, a device ID, a reticle information, an align mark and/or a measuring point for providing to the analysis program in order to execute the aforementioned analysis and validation processes. Databases 310, 312, and 314 are databases accessed during both the analysis and the validation processes, for example, a foundry design rule database and foundry technology database; please note that this is only an example, and not meant as a limitation of the present invention.

It should be noted that, as shown in FIG. 3, the automated system 302 performs data transmissions with the predetermined layer mapping table 308 and databases 310, 312, 314 via the transmission interface 316. In addition, the transmission interface 316 can be, as example without limitation, a protocol, a data bus or a transmission media, wherein the transmission medium may be coaxial cable, copper wire or fiber optic, but can also take the form of acoustic, light, or carrier waves.

Please refer to FIG. 4. FIG. 4 illustrates the layout information that the system shown in FIG. 3 produces when executing the method shown in FIG. 1. In this embodiment, the second layout information is produced by the automated system 302 shown in FIG. 3, which automatically receives the first layout information transmitted by the user, and analyzes the first layout information via an automated mechanism. As shown in FIG. 4, the contents of a foundry device in the second layout information are not allowed to be modified manually. As a result, when the contents of the device of the second layout information are erroneous, the automated system 302 informs the user end to modify the predetermined layer mapping table 308 determined and restarts the automated process shown in FIG. 1 to analyze the revised layout information in order to produce the correct (compliant) second layout information. In addition, when the user end finds an unused foundry device in the second layout information, the user end need only delete that foundry device from the second layout information without performing additional modifications to the contents of that foundry device; the minimal intervention prevents accidental modifications that may seriously alter the analysis result. It should be noted that, FIG. 4 is for illustrative purposes only and is not meant to be a limitation of the present invention.

In conclusion, an embodiment of the present invention provides a method of automatically producing layout information and an apparatus for implementing the said method. Herein, after the user end provides first layout information of an integrated circuit, the user end need not perform additional settings related to producing the second layout information; the said method and apparatus of the present invention will start an automated process to produce the said second layout information from the provided first layout information of integrated circuit. As a result, because the automated mechanism disclosed by the present invention is capable of automatically analyzing the first layout information of the integrated circuit, the semiconductor foundries' employees do not need to manually process the first layout information. Therefore, in contrast to the prior art, the method and the apparatus of the present invention will considerably increase the data processing efficiency and prevent data transfer errors caused by manual processing.

In another embodiment of the present invention, the method and apparatus of the present invention can interpret the device names from the marks and/or numbers in the analysis result of the first layout information via the assistance of a predetermined layer mapping table. As a result, the second layout information output is capable of conveniently displaying the device names for later processing, as shown in FIG. 4, therefore preventing the related people from comparing the represented information against the marks and/or numbers. Thus, the method and apparatus of the present invention can further reduce errors caused by manual intervention.

Furthermore, in another embodiment of the present invention, the method and apparatus of the present invention not only provide an automated mechanism to analyze the first layout information for obtaining the second layout information, but can also validate the accuracy of the first layout information according to the second layout information. As a result, if the automated mechanism detects errors in the original first layout information, it will inform the user end to perform appropriate modifications. The method and apparatus of the present invention automatically analyze the revised first layout information again to produce the second layout information corresponding to the revised first layout information. Similarly, the method and apparatus of the present invention will also perform an automated validation process for this second layout information to examine whether the aforementioned revised first layout information is compliant. If the revised first layout information is correct, then the method and apparatus of the present invention will output the corresponding second layout information. As a result, the method and apparatus of the present invention not only produce the second layout information, but also further validate whether the layout is correct according to the produced second layout information. In conclusion, the method and the apparatus of the present invention will ensure the final output second layout information indeed conforms to the users' needs.

Those skilled in the art will readily observe that numerous modifications and alterations of the device and method may be made while retaining the teachings of the invention.

What is claimed is:

1. A method for automatically producing layout information, comprising:
   receiving first layout information of an integrated circuit;
   when receiving the first layout information, activating an automated process mechanism to stores the first layout information into a reference database;
   reading the first layout information from the reference database by the automated process mechanism; and
   analyzing the first layout information to obtain second layout information by the automated process mechanism, comprising:
      providing a predetermined layer mapping table, wherein the predetermined layer mapping table records a plurality of foundry device IDs and a plurality of layer information mapping relationships; and
      producing the second layout information according to an analysis result of the first layout information and the predetermined layer mapping table.

2. The method of claim 1, wherein the second layout information comprises at least foundry process information.

3. The method of claim 1, wherein the step of activating the automated process mechanism further comprises:
   validating accuracy of the first layout information according to the second layout information.

4. The method of claim 1, wherein a format of the second layout information is different from a format of the first layout information.

5. The method of claim 4, wherein the format of the second layout information corresponds to a mask format.

6. A method for automatically producing layout information, comprising:
   receiving first layout information of an integrated circuit;
   analyzing the first layout information to obtain an analysis result;

providing a predetermined layer mapping table, wherein the predetermined layer mapping table records a plurality of foundry device IDs and a plurality of layer information mapping relationships; and utilizing a processor for producing second layout information according to an analysis result of the first layout information and the predetermined layer mapping table.

7. The method of claim 6, wherein a format of the second layout information is different from a format of the first layout information.

8. The method of claim 7, wherein the format of the second layout information corresponds to a mask format.

9. A method for automatically producing layout information, comprising:

receiving first layout information of an integrated circuit; and utilizing a processor for analyzing the first layout information to obtain second layout information, and validating the accuracy of the first layout information according to the second layout information, wherein the step of analyzing the first layout information for obtaining the second layout information comprises:

providing a predetermined layer mapping table, wherein the predetermined layer mapping table records a plurality of foundry device IDs and a plurality of layer information mapping relationships; and producing the second layout information according to an analysis result of the first layout information and the predetermined layer mapping table.

10. The method of claim 9, wherein a format of the second layout information is different from a format of the first layout information.

11. The method of claim 10, wherein the format of the second layout information corresponds to a mask format.

* * * * *